US012644908B2

(12) United States Patent
Oh

(10) Patent No.: US 12,644,908 B2
(45) Date of Patent: Jun. 2, 2026

(54) TEST SOCKET

(71) Applicant: TSE CO., LTD, Cheonan-si (KR)

(72) Inventor: Chang Su Oh, Cheonan-si (KR)

(73) Assignee: TSE CO., LTD., Chungcheongnam-Do (KR)

( * ) Notice: Subject to any disclaimer, the term of this patent is extended or adjusted under 35 U.S.C. 154(b) by 336 days.

(21) Appl. No.: 18/468,846

(22) Filed: Sep. 18, 2023

(65) Prior Publication Data

US 2024/0094251 A1     Mar. 21, 2024

(30) Foreign Application Priority Data

Sep. 20, 2022    (KR) ........................ 10-2022-0118663

(51) Int. Cl.
*G01R 1/067*          (2006.01)
*G01R 1/04*           (2006.01)
(52) U.S. Cl.
CPC ....... *G01R 1/06722* (2013.01); *G01R 1/0408* (2013.01)
(58) Field of Classification Search
CPC ........................... G01R 1/06722; G01R 1/0408
See application file for complete search history.

(56) References Cited

U.S. PATENT DOCUMENTS 8,808,037 B2 *  8/2014  Park ..................... H01R 12/714
                                                          439/700
10,557,867 B2   2/2020  Teranishi et al.

11,387,584 B1   7/2022  Hwang et al.
11,506,684 B2  11/2022  Ueyama
2003/0124895 A1*  7/2003  Winter .............. H01R 13/2421
                                                          439/219
2018/0340957 A1  11/2018  Teranishi et al.
(Continued)

FOREIGN PATENT DOCUMENTS

JP     2018-066711 A     4/2018
JP     2020-051861 A     4/2020
(Continued)

OTHER PUBLICATIONS

Office Action dated Apr. 17, 2024 (12 pages including English Translation) out of the counterpart Taiwan Application No. TW 112135808 A filed Sep. 20, 2023.
(Continued)

*Primary Examiner* — Paresh Patel
(74) *Attorney, Agent, or Firm* — Crowell & Moring LLP

(57)          ABSTRACT

A test socket including: a testing probe including a lower plunger in contact with a pad; an upper plunger coupled to the lower plunger; a spring probe made of a cylindrical spring for applying elasticity to the lower plunger and the upper plunger; and a contact probe with an upper side contacting a terminal of a test device and a lower side contacting the upper plunger; a socket housing that provides housing holes and accommodates the contact probe and the spring probe so that an upper side of the contact probe protrudes at each housing hole; and a cover that provides cover holes and is fastened to the socket housing so that a lower side of the lower plunger protrudes at each cover hole, wherein the upper plunger provides a sliding groove, the lower plunger provides a pair of sliding protrusions inserted into the sliding groove.

10 Claims, 12 Drawing Sheets

(56)     References Cited

U.S. PATENT DOCUMENTS

| 2022/0034937 A1 | 2/2022 | Ueyama |
| 2022/0209449 A1 | 6/2022 | Hwang et al. |

FOREIGN PATENT DOCUMENTS

| JP | 2021-105547 A | 7/2021 |
| KR | 10-1246122 B1 | 3/2013 |
| KR | 10-1396377 B1 | 5/2014 |
| KR | 10-1455174 B1 | 10/2014 |
| KR | 10-1629866 B1 | 6/2016 |
| KR | 10-2018-0038031 A | 4/2018 |
| KR | 10-1865367 B1 | 6/2018 |
| KR | 10-1957717 B1 | 7/2019 |
| KR | 10-2022-0043866 A | 4/2022 |
| TW | 202131001 A | 8/2021 |
| TW | 202227822 A | 7/2022 |

OTHER PUBLICATIONS

Office Action dated Oct. 24, 2022 (10 pages) out of corresponding Korean Patent Application 10-2022-0118663.

Decision of Patent dated Nov. 9, 2022 (4) pages including English translation out of corresponding Korean Patent Application 10-2022-0118663.

* cited by examiner

FIG. 4
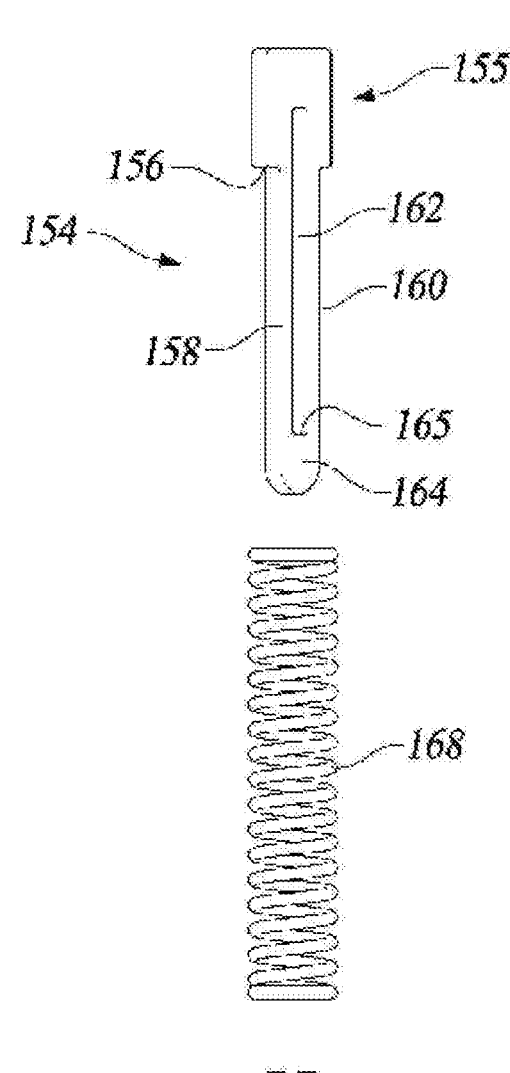
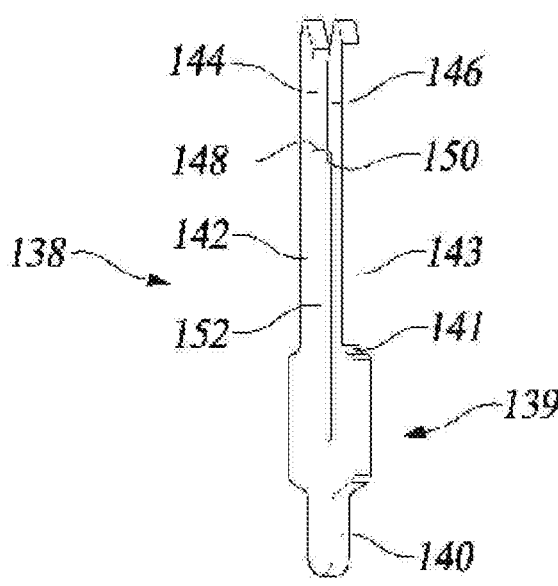

*138a*

*138b*

*M1*
*M2*
*M1*

*138c*

*M1*
*M2*

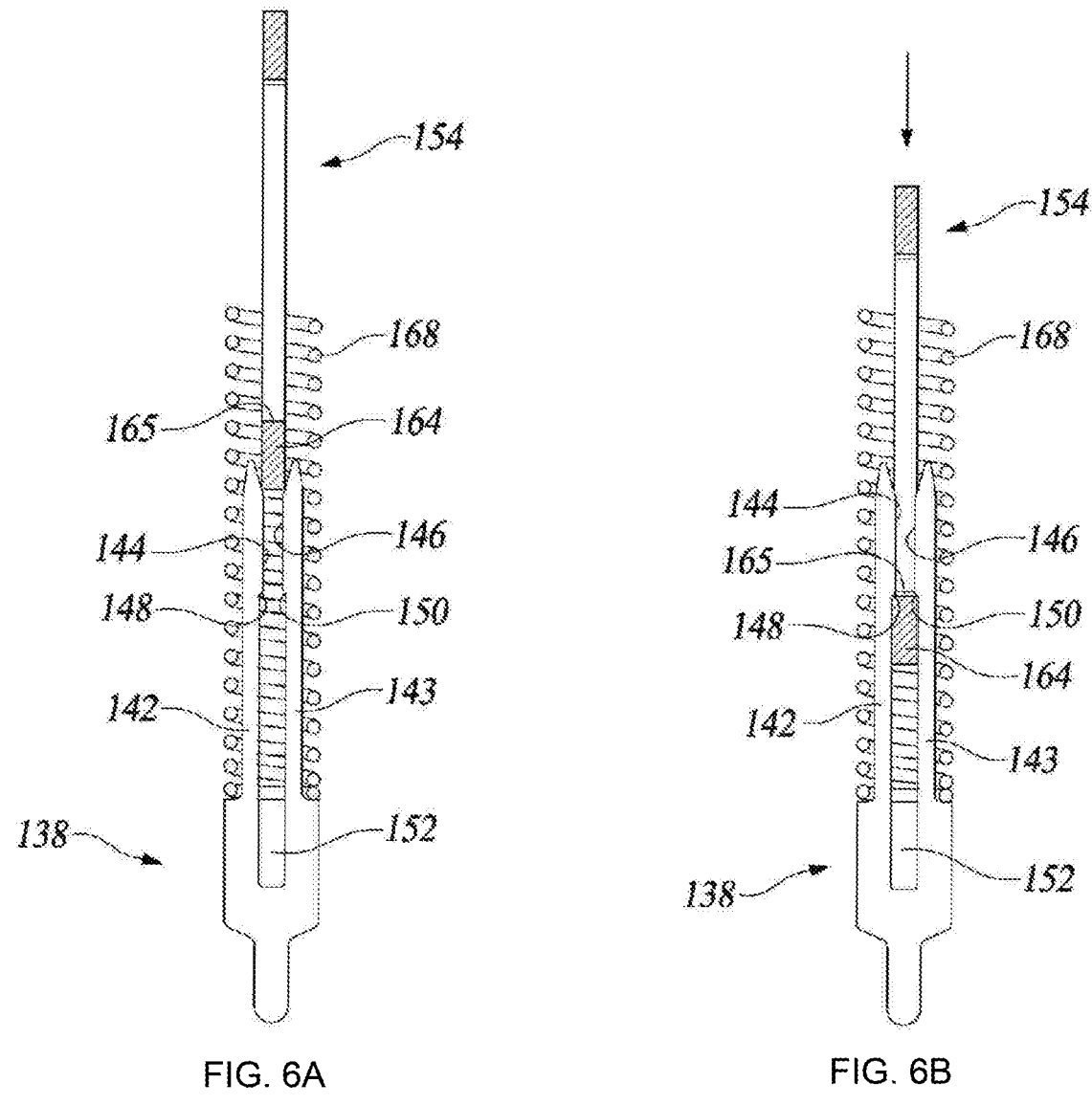
FIG. 6A                                    FIG. 6B

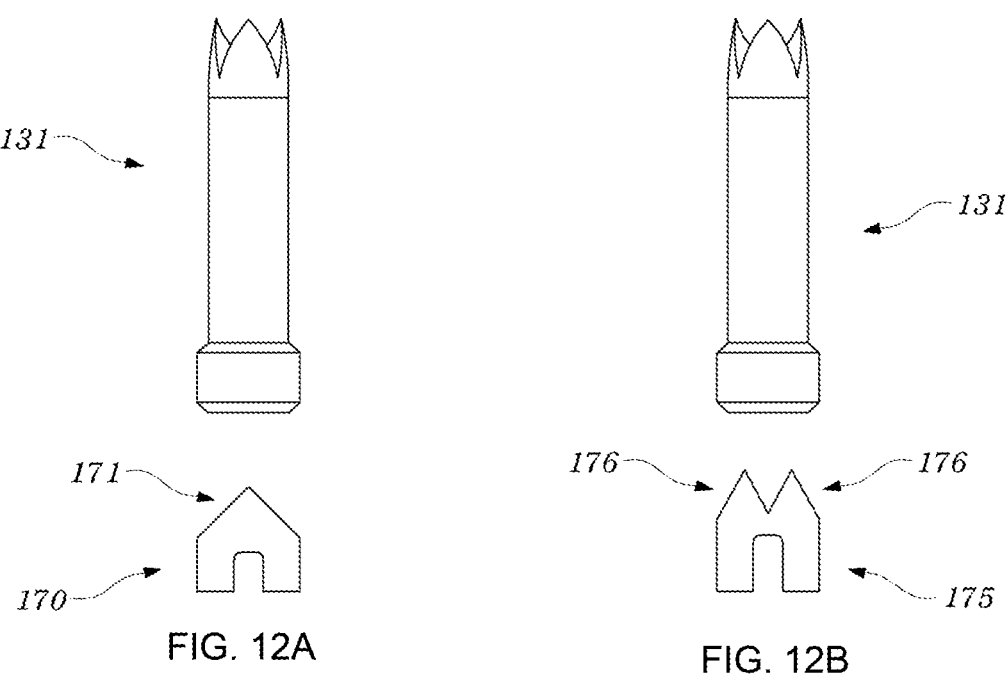
FIG. 12A
FIG. 12B
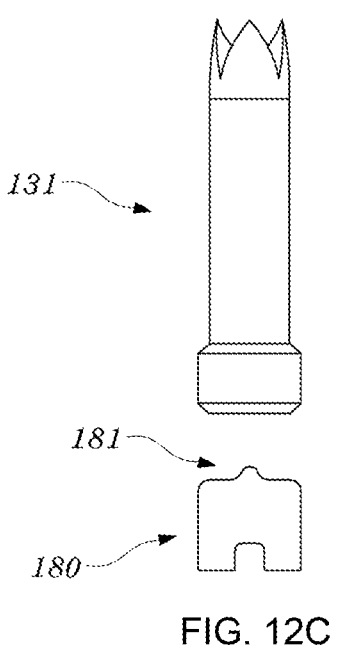
FIG. 12C
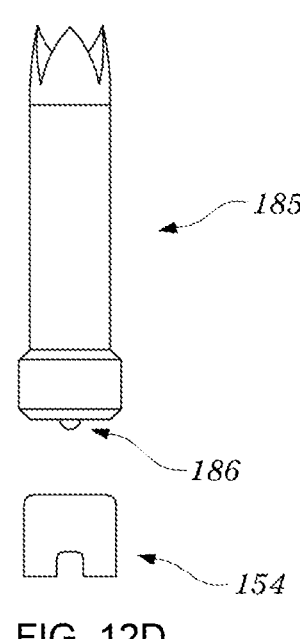
FIG. 12D

TEST SOCKET

This application claims under 35 U.S.C. § 119(a) the benefit of the filing date of Korean Patent Application No. 10-2022-0118663, filed on Sep. 20, 2022.

BACKGROUND OF THE INVENTION

Technical Field

The present disclosure relates to a test socket, and, more particularly, to a test socket used for electrical testing of a test device.

Background Art

The test device (e.g., the semiconductor package) is formed by densely integrating fine electronic circuits, and is tested for the normality of each electronic circuit during the manufacturing process. The testing process is a process of testing whether the test device is operating normally and sorting out good and defective products.

In the process of testing the test device, a test socket is used to electrically connect the test device and the tester applying the test signal. That is, the tester and the test device are not directly connected, but indirectly through the test socket.

Among conventional semiconductor packages, in the case of a ball grid array (BGA) package, the test socket has a structure in which the socket pin is embedded in the socket barrel, and is manufactured by a forming mold and a machining method. As a socket pin, a pogo pin having elasticity is mainly used.

In general, the pogo pin consists of a structure in which an upper pin connected to the test device and a lower pin connected to the pad of the tester are disposed on the upper and lower parts of the barrel, respectively, and a spring is interposed between the upper pin and the lower pin.

As the number of uses of the pogo pin increases, problems arise as tin, which is the main component of the ball, formed in the test device is transferred. The accumulation of foreign substances such as tin in the upper pin increases the contact resistance, which reduces the testing accuracy and reliability.

An ultrasonic cleaning of pogo pins can be used to restore the reliability of the examination of pogo pins, but this cleaning process is not practical because it increases the testing time and cost.

Another cleaning method is cleaning through a repetitive friction process by a brush, but there is a problem that practicality is likewise reduced because of wear on the contact part of the upper pin.

In addition, the conventional pogo pin has a problem that if the upper pin is damaged in the process of repeated testing, the entire pin must be replaced, so the replacement cost is high.

Related Art

Public Patent Publication No. 2022-0043866 (2022. 04. 05)

SUMMARY OF THE INVENTION

Taking into consideration the points described above, the present disclosure is devised and aims to provide a test socket that is easy to manufacture and allows for the replacement of only the components that come into repeated contact with the test device terminals, thus reducing maintenance costs associated with the component replacement.

In addition, the present disclosure aims to provide a test socket in which the electrical connection between the components is stable when in contact with the test device, the electrical resistance is small, and the signal transmission is stably performed.

The test socket, according to the present disclosure for solving the above objectives, performing an electrical testing on a test device by connecting a terminal of a test device to a pad of a tester that generates a test signal, comprises: a testing probe comprising a lower plunger in contact with the pad; an upper plunger coupled to the lower plunger; a spring probe made of a cylindrical spring for applying elasticity to the lower plunger and the upper plunger for them to be separated from each other; and a contact probe with an upper side contacting a terminal of the test device and a lower side contacting the upper plunger; a socket housing that provides a housing hole at each position corresponding to a terminal of the test device and accommodates the contact probe and the spring probe so that an upper side of the contact probe protrudes at each housing hole; and a cover that provides a cover hole at each position corresponding to the housing hole and is fastened to the socket housing so that a lower side of the lower plunger protrudes at each cover hole, wherein the upper plunger provides a sliding groove, the lower plunger provides a pair of sliding protrusions inserted into the sliding groove, and the upper plunger and the lower plunger are coupled in a sliding manner.

The lower plunger may include a stopper part provided in the sliding protrusion so that the stopper part is in contact with the upper plunger to prevent the sliding protrusion from deviating from the sliding groove.

The upper plunger may include a upper plunger contact part in contact with the contact probe; and a first upper plunger arm and a second upper plunger arm extending from the upper plunger contact part and being disposed facing each other, wherein the sliding groove may be located between the first upper plunger arm and the second upper plunger arm, and a detent part may be connected to at least one of the first upper plunger arm and the second upper plunger arm and prevent the sliding protrusion from deviating from the sliding groove by contacting the stopper part.

The upper plunger may include a connection part connecting the end of the first upper plunger arm and the end of the second upper plunger arm, wherein the detent part may be provided in the connection part.

The upper plunger may include a first upper plunger inclination portion and a second upper plunger inclination portion formed inclined to both ends of the connection part and symmetrical with respect to the longitudinal central axis of the upper plunger.

The upper plunger may include a upper plunger contact part in contact with the contact probe; and a first upper plunger arm and a second upper plunger arm extending from the upper plunger contact part and being disposed facing each other, wherein the sliding groove may be located between the first upper plunger arm and the second upper plunger arm, and the sliding protrusion may be tilted inside the sliding groove so that one end of the sliding protrusion is in contact with the first upper plunger arm, the other end of the sliding protrusion is in contact with the second upper plunger arm, and two or more contact points with the upper plunger are formed.

The lower plunger may include a lower plunger contact part in contact with the pad; a first lower plunger arm and a second lower plunger arm extending from the lower plunger contact part and being disposed facing each other; and a slit provided between the first lower plunger arm and the second lower plunger arm, wherein the sliding protrusion is provided in the first lower plunger arm and the second lower plunger arm, respectively, and the upper plunger may include an upper plunger contact part in contact with the contact probe; a first upper plunger arm and a second upper plunger arm extending from the upper plunger contact part and being disposed facing each other; and a connection part connecting the first upper plunger arm and the second upper plunger arm to be inserted into the slit, wherein the connection part may be tilted inside the slit so that one end of the connection part is in contact with the first lower plunger arm, the other end of the connection part is in contact with the second lower plunger arm, and two or more contact points with the lower plunger are formed.

The lower plunger may include an internal inclination portion of the first lower plunger arm provided in a form inclined to the inner side surface of the first lower plunger arm end; an external inclination portion of the first lower plunger arm provided in a form inclined to the outer side surface of the first lower plunger arm end; an internal inclination portion of the second lower plunger arm provided in a form inclined to the inner side surface of the second lower plunger arm end; and an external inclination portion of the second lower plunger arm provided in a form inclined to the outer side surface of the second lower plunger arm end, wherein the internal inclination portion of the first lower plunger arm and the internal inclination portion of the second lower plunger arm may be symmetrical with respect to the longitudinal central axis of the lower plunger, and the external inclination portion of the first lower plunger arm and the external inclination portion of the second lower plunger arm may be symmetrical with respect to the longitudinal central axis of the lower plunger.

The upper plunger may have a contact protrusion in point contact with the contact probe.

The contact probe may have a contact protrusion in point contact with the upper plunger.

The contact probe may include a plurality of tip parts in point contact with the terminal of the test device.

The test socket according to the present disclosure can maintain that the lower plunger and the upper plunger of the spring probe are in contact with each other while forming two or more contact points when the spring probe is subjected to a compression force while the test device is in contact with the test probe. Therefore, the electrical connection between the lower plunger and the upper plunger, and the electrical connection between the contact probe and the spring probe are stable, the electrical resistance is small, and the signal transmission can be stably achieved.

In addition, the test socket according to the present disclosure is easy to manufacture, and only the contact probe that repeatedly comes into contact with the terminal of the test device can be replaced, so that the maintenance cost because of component replacement is low.

BRIEF DESCRIPTION OF THE DRAWINGS

FIG. 4 is a decomposition of a spring probe of a test socket according to an embodiment of the present disclosure.

FIGS. 6A and 6B illustrate the assembly process of a spring probe according to an embodiment of the present disclosure.

FIGS. 12A-12D illustrate various variants of the testing probe.

DETAILED DESCRIPTION

Hereinafter, the test socket according to the present disclosure will be described in detail with reference to the drawings.

Figure 1:
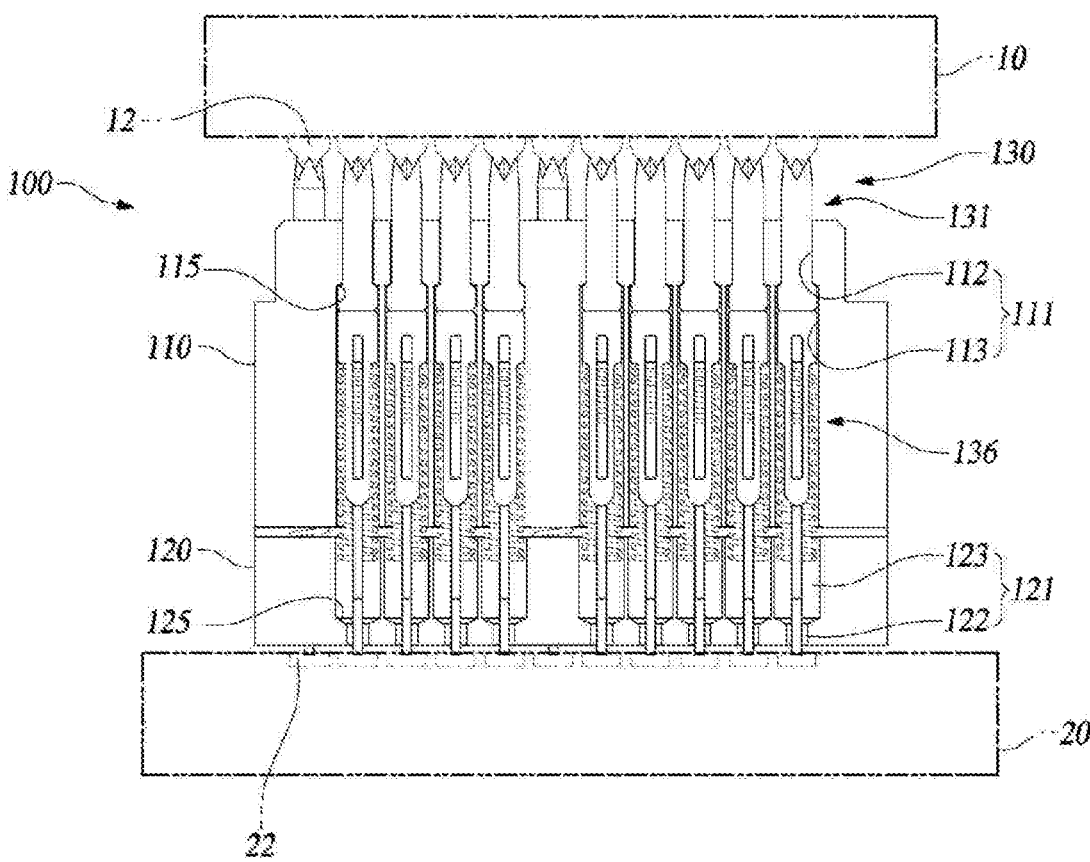
FIG. 1 is a cross-sectional view illustrating a test socket according to an embodiment of the present disclosure.
Figure 2:
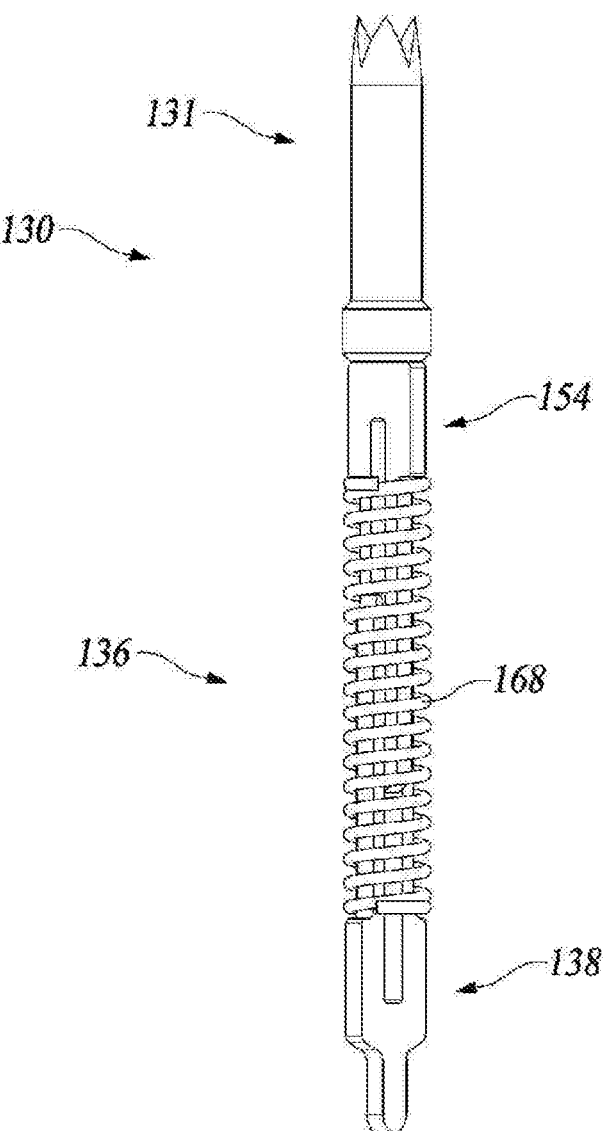
FIG. 2 is a perspective view illustrating a testing probe of a test socket according to an embodiment of the present disclosure.
Figure 3:
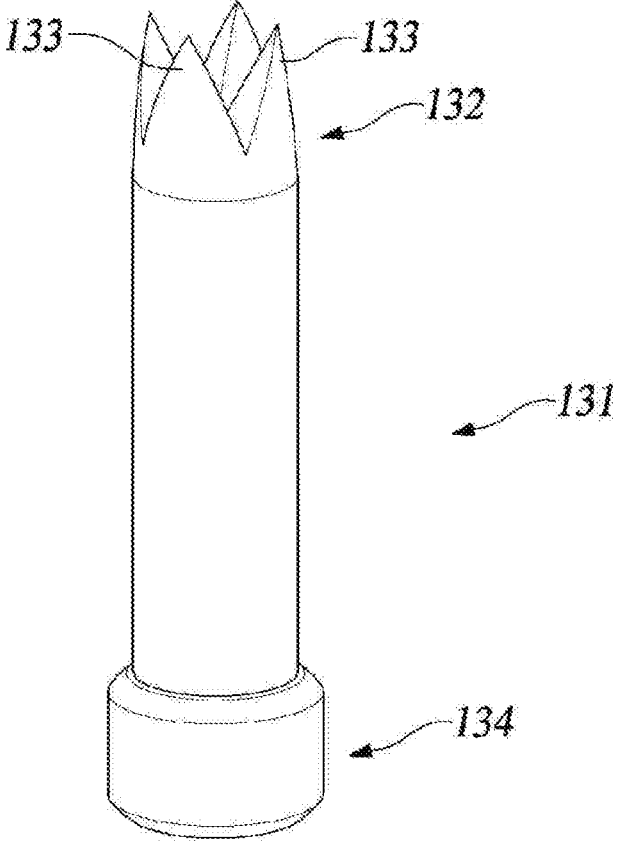
FIG. 3 is a perspective view illustrating a contact probe of a test socket according to an embodiment of the present disclosure.

FIG. 1 is a cross-sectional view illustrating a test socket according to an embodiment of the present disclosure.

As shown in the drawings, the test socket 100 according to an embodiment of the present disclosure is for performing an electrical testing of the test device 10 by connecting the terminal 11 of the test device 10 to the pad 22 of the tester 20. The test socket 100 includes a socket housing 110, a cover 120, and a plurality of testing probes 130 supported by the socket housing 110 and the cover 120. The socket housing 110 and the cover 120 may support the testing probe 130 by being intercoupled with a screw bond or in various other ways.

The socket housing 110 is where a portion of the testing probe 130 is mounted and supports a plurality of testing probes 130 together with the cover 120. In the socket housing 110, a plurality of housing holes 111 in which the testing probe 130 for testing is inserted, are formed. The housing hole 111 is formed to penetrate the socket housing 110 in the direction of thickness. The housing hole 111 includes a housing outer hole 112 extending from one surface of the socket housing 110 to the inside of the socket housing 110, and a housing inner hole 113 connected to the housing outer hole 112 and extending to the other surface of the socket housing 110. Here, one surface of the socket housing 110 is a surface facing the test device 10. The width of the housing outer hole 112 is smaller than the width of the housing inner hole 113. Inside the housing hole 111, a portion of the testing probe 130 is contacted to form a housing ledge 115 that prevents the testing probe 130 from deviating from the housing hole 111.

The cover 120 is coupled to the other surface of the socket housing 110 to support a plurality of testing probes 130. The cover 120 has a plurality of cover holes 121 corresponding to a plurality of housing holes 111. The cover hole 121 is formed to penetrate the cover 120 in the direction of thickness. The cover hole 121 includes a cover outer hole 122 extending from one surface of the cover 120 to the inside of the cover 120, and a cover inner hole 123 connected to the cover outer hole 122 and extending to the other surface of the cover 120. Here, the other surface of the cover 120 is a surface facing the socket housing 110. The width of the cover outer hole 122 of the cover is smaller than the width of the cover inner hole 123 of the cover. The cover inner hole 123 may be designed in width equal to the width of the housing inner hole 113. Inside the cover hole 121, a portion of the testing probe 130 is contacted to form a cover ledge 125 that prevents the testing probe 130 from deviating from the cover hole 121.

In addition to the structures shown, the socket housing 110 and the cover 120 may be mutually coupled to various other structures capable of supporting a plurality of testing probes 130. For example, the specific shape or number of housing holes 111 provided in the socket housing 110 and the specific shape or number of cover holes 121 provided in the cover 120 can be variously changed.

With reference to FIGS. 1 to 4, the testing probe 130 may electrically connect the terminal 12 of the test device 10 and the pad 22 of the tester 20 by being supported by the socket housing 110 and the cover 120. The testing probe 130 may transmit a test signal generated by the tester 20 to the test device 10 and may transmit a response signal generated by the test device 10 to the tester 20. The testing probe 130 includes a contact probe 131 in contact with the terminal 12 of the test device 10 and a spring probe 136 that electrically connects the pad 22 of the contact probe 131 and the tester 20.

The contact probe 131 consists of a conductive material that can be electrically connected to the test device 10 by contacting the terminal 12 of the test device 10. The contact probe 131 may consist of a copper alloy coated with gold or other conductive material to transmit an electrical signal. The contact probe 131 includes a first contact part 132 that may be in contact with the terminal 11 of the test device 10 and a second contact part 134 that is in contact with the spring probe 136. As shown, the first contact part 132 may pass through the housing outer hole 112 because its width is smaller than the width of the housing outer hole 112 of the socket housing 110. On the other hand, the second contact part 134 cannot pass through the housing outer hole 112 because its width is greater than the width of the housing outer hole 112. The contact probe 131 can be moved in the housing hole 111, but the second contact part 134 is caught in the housing ledge 115 of the socket housing 110 and cannot be separated from the socket housing 110 through the outer hole 112.

The first contact part 132 includes a plurality of tip parts 133 that may contact the terminal 11 of the test device 10. The plurality of tip parts 133 as shown may be spaced apart in the circumferential direction so that they can be stably connected to the terminal 11 of the test device 10. Each tip part 133 may consist of a pointed end so that it can be in point contact with the terminal 12 of the test device 10. The tip part 133 is a part that repeatedly contacts the terminal 12 of the test device 10 to be tested, and tin, which is the main component of the terminal 12, may be transferred and accumulated. The contact probe 131 according to an embodiment of the present disclosure may reduce the problem that the components of the terminal 12 accumulate and the contact resistance increases by the shape in which the tip part 133 is in point contact with the terminal 12.

The contact probe 131 may be formed through a cutting process such as lathe machining. The contact probe 131 manufactured through the cutting processing may have a sharp tip part 133 as shown.

The second contact part 134 is electrically connected to the spring probe 136 in contact with the spring probe 136 in the housing hole 111. The second contact part 134 may have a flat surface so that it can be in stable contact with the spring probe 136.

The configuration of the contact probe 131 is not limited to the illustrated one and can be changed in various ways. For example, the specific configuration of the tip part 133 such as the shape, the number, and the disposition interval of the tip part 133 may be variously changed. The drawing shows that the width of the second contact part 134 of the contact probe 131 is greater than the width of the first contact part 132, but the shape of the contact probe 131 may be variously changed.

The spring probe 136 is disposed in the housing hole 111 and the cover hole 121 so that one end is in contact with the contact probe 131 and the other end protrudes to the outside of the cover 120 to contact the pad 22 of the tester. The spring probe 136 includes a lower plunger 138 in contact with the pad 22 of the tester, an upper plunger 154 in contact with the contact probe 131, and a spring 168 capable of applying an elastic force to the lower plunger 138 and the upper plunger 154.

The lower plunger 138 may partially protrude to the outside of the cover 120 and contact the pad 22 of the tester. The lower plunger 138 may consist of a copper alloy coated with gold or other conductive material to transmit an electrical signal. The lower plunger 138 includes a lower plunger contact part 139 and a pair of lower plunger arms 142 and 143 that are connected to the lower plunger contact part 139 to be combined with the upper plunger 154.

The lower plunger contact part 139 includes a protrusion part 140 that protrudes to the outside of the cover 120 through the cover outer hole 122 of the cover 120 and can contact the pad 22 of the tester. One end of the lower plunger contact part 139 is provided with a ledge part 141 that the spring 168 can contact. A portion of the lower plunger contact part 139 has a size that cannot pass through the cover outer hole 122.

A pair of lower plunger arms 142 and 143 extend from the lower plunger contact part 139. These lower plunger arms 142 and 143 may be disposed in parallel facing each other. Hereinafter, a pair of lower plunger arms 142 and 143 will be described by dividing them into a first lower plunger arm 142 and a second lower plunger arm 143. At the end of the first lower plunger arm 142, a sliding protrusion 144 protruding towards the second lower plunger arm 143 is provided, and at the end of the second lower plunger arm 143 a sliding protrusion 146 protruding towards the first lower plunger arm 142 is provided. At one end of the sliding protrusion 144 provided in the first lower plunger arm 142, a stopper part 148 capable of contacting the upper plunger 154 is provided. In addition, at one end of the sliding protrusion 146 provided in the second lower plunger arm 143, a stopper part 150 is provided for contact with the upper plunger 154. Between the first lower plunger arm 142 and the second lower plunger arm 143, a slit 152 is formed in which the upper plunger 154 can be partially inserted. The slit 152 may extend to the middle portion of the lower plunger contact part 139. The first lower plunger arm 142 and the second lower plunger arm 143 may be elastically deformed, so that the spacing between the sliding protrusions 144 and 146 provided respectively may change.

The lower plunger 138 may be formed in a symmetrical structure with a constant thickness through the MEMS process. Using the MEMS process, a large number of lower plungers 138 can be mass-produced, thereby reducing the manufacturing cost.

The specific configuration or manufacturing method of the lower plunger 138 may be variously changed.

The upper plunger 154 may electrically connect the contact probe 131 and the lower plunger 138 by contacting the contact probe 131 and the lower plunger 138. The upper plunger 154 may consist of a copper alloy coated with gold or other conductive material to transmit an electrical signal. The upper plunger 154 includes an upper plunger contact part 155, a pair of upper plunger arms 158 and 160 connected to the upper plunger contact part 155 to be combined with the lower plunger 138, and a connection part 164 connecting a pair of upper plunger arms 158 and 160.

The upper plunger contact part 155 may be electrically connected to the contact probe 131 by contacting the second contact part 134 of the contact probe 131 at one end. At the other end of the upper plunger contact part 155, a ledge part 156 that the spring 168 can contact is provided.

A pair of upper plunger arms 158 and 160 extend from the upper plunger contact part 155. These pairs of upper plunger arms 158 and 160 may be disposed in parallel facing each other. Hereinafter, a pair of upper plunger arms 158 and 160 will be described by dividing them into a first upper plunger arm 158 and a second upper plunger arm 160. Between the first upper plunger arm 158 and the second upper plunger arm 160, a sliding groove 162 is formed in which the sliding protrusions 144 and 146 of the lower plunger 138 can be inserted. The sliding groove 162 may extend to the middle portion of the upper plunger contact part 155.

The connection part 164 connects the end of the first upper plunger arm 158 to the end of the second upper plunger arm 160. A detent part 165 is provided to the connection part 164. The detent part 165 may prevent the sliding protrusion 144 and 146 inserted into the sliding groove 162 from deviating from the sliding groove 162 by contacting the stopper parts 148 and 150 of the lower plunger 138.

The upper plunger 154, like the lower plunger 138, may be formed in a left-right symmetrical structure with a constant thickness through the MEMS process. Using the MEMS process, a large number of upper plungers 154 can be mass-produced, thereby reducing the manufacturing cost.

The lower plunger 138 and the upper plunger 154 may be formed at a constant thickness through the MEMS process. In addition, the lower plunger 138 and the upper plunger 154 may be formed with the same thickness through the MEMS process. The thicknesses of the lower plunger 138 and the upper plunger 154 may be different. When the thickness of the lower plunger 138 and the upper plunger 154 is different, the ratio of the thickness difference between the lower plunger 138 and the upper plunger 154 should be less than 1:4. In the case that the ratio of the thickness difference between the lower plunger 138 and the upper plunger 154 is 1:4 or more, it is not desirable because the durability of the spring probe 136 as a whole may decrease as the strength of the plunger with the relatively small thickness may fall, and much material is required for manufacturing the plunger with relatively high thickness.

The MEMS process is a method of manufacturing parts by forming a certain pattern through a plating process and then filling the material using plating technology in the molding mold. The lower plunger 138 and the upper plunger 154 may be formed in the form of a single layer by a single material or in the form of a multilayer by a plurality of heterogeneous materials through the MEMS process.

Figure 5A:
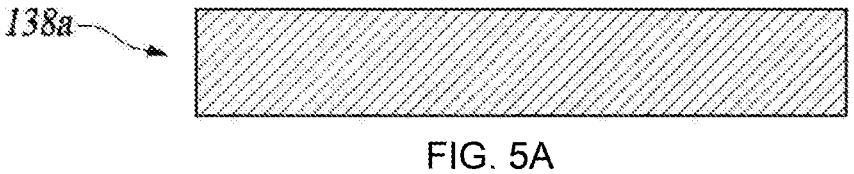
FIGS. 5A-5C illustrate a cross-section of the lower plunger according to various other embodiments.
Figure 5B:
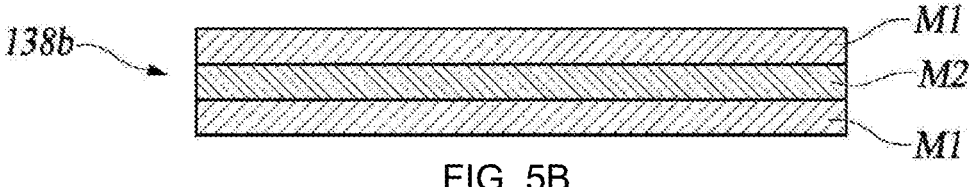

FIGS. 5A and 5B illustrate a cross-section of the lower plunger according to various other embodiments.

Figure 5C:
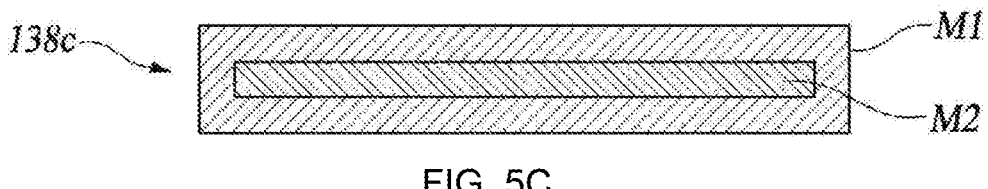

As shown in FIG. 5A, the lower plunger 138a may be formed in the form of a single layer by a single material through a MEMS process. In addition, as shown in FIG. 5B, the lower plunger 138b may be formed in the form of a multilayer in which the first material M1 and the second material M2 are alternately stacked. In addition, as shown in FIG. 5C, the lower plunger 138c may be formed in the form of a multilayer in which the first material M1 wraps around the second material M2.

The upper plunger 154 may also be formed in the form of a single layer or a multilayer such as the lower plunger 138a, 138b, and 138c above through the MEMS process.

The specific configuration or manufacturing method of the upper plunger 154 may be variously changed. For example, the connection part 164 of the upper plunger 154 may be omitted. In this case, a detent part in contact with the stopper parts 148 and 150 of the lower plunger 138 may be connected to at least one of the first upper plunger arm 158 and the second upper plunger arm 160.

The spring 168 is coupled to the lower plunger 138 and the upper plunger 154 so that one end is in contact with the ledge part 141 of the lower plunger 138 and the other end is in contact with the ledge part 156 of the upper plunger 154. The spring 168 may apply an elastic force so that the lower plunger 138 and the upper plunger 154 are separated from each other by being in contact with the lower plunger 138 and the upper plunger 154.

In addition to the cylindrical or coil spring form as shown, the spring 168 may consist of various forms that can apply an elastic force so that the lower plunger 138 and the upper plunger 154 are separated from each other. In addition, the connection method of the spring 168 and the lower plunger 138 or the connection method of the spring 168 and the upper plunger 154 may be variously changed.

The spring probe 136 can be easily assembled without a separate fixing member. That is, the lower plunger 138 constituting the spring probe 136, the upper plunger 154, and the spring 168 may be combined in an interlocking manner to form a single assembly. FIGS. 6A and 6B illustrate the assembly process of a spring probe 136 and the process of assembling the spring probe 136 is as follows.

First, the spring 168 wraps around a pair of lower plunger arms 142 and 143 and is coupled to the lower plunger 138 so that one end of the spring 168 is in contact with the ledge part 141 of the lower plunger contact part 139. Thereafter, as shown in FIG. 6A, a portion of the upper plunger 154 is placed in the spring 168 so that the connection part 164 of the upper plunger 154 is located between the first lower plunger arm 142 and the second lower plunger arm 143. Thereafter, as shown of FIG. 6B, the lower plunger 138 and the upper plunger 154 are combined in a sliding manner by exerting a pressure on the lower plunger 138 or the upper plunger 154 in the direction in which the lower plunger contact part 139 and the upper plunger contact part 155 are close to each other. In this case, the connection part 164 is inserted into the slit and the sliding protrusions 144 and 146 are inserted into the sliding groove 162 while the connection part 164 elastically deforms the first lower plunger arm 142 and the second lower plunger arm 143 by pushing a pair of sliding protrusions 144 and 146 in a direction being away from each other. The lower plunger 138 and the upper plunger 154 combined in a sliding manner cannot be easily separated as the stopper parts 148 and 150 of the lower plunger 138 and the detent part 165 of the upper plunger 154 contact each other.

In a state that the lower plunger 138 and the upper plunger 154 are combined, one end of the spring 168 is in contact with the ledge part 141 of the lower plunger 138 and the other end is in contact with the ledge part 156 of the upper plunger contact part 155. Thus, the spring 168 can apply an elastic force so that the lower plunger 138 and the upper plunger 154 are separated from each other. Because of the elastic force of the spring 168, the lower plunger 138 and the upper plunger 154 can maintain the relative position in which the lower plunger contact part 139 and the upper plunger contact part 155 are maximally distant. The stopper parts 148 and 150 of the lower plunger 138 and the detent part 165 of the upper plunger 154 may be in contact with each other while the lower plunger contact part 139 and the upper plunger contact part 155 are maximally distant.

The lower plunger 138 and the upper plunger 154 can move relative to each other in a sliding manner. That is, when a pressure is exerted on the lower plunger 138 or the upper plunger 154, the connection part 164 slides in the slit 152, and the sliding protrusions 144 and 146 slide into the sliding groove 162, so that the distance between the lower plunger contact part 139 and the upper plunger contact part 155 may change.

The spring probe 136 may connect electrically the test pad 22 and the contact probe 131 by the lower plunger 138 and the upper plunger 154 being combined in a sliding manner and contacting each other. In addition, the spring probe 136 may be compressed when the pressure is exerted and be restored when the pressure is removed by the lower plunger 138 and the upper plunger 154 being elastically supported by the spring 168.

The lower plunger 138 and the upper plunger 154 have additional configurations for structural stability of the spring probe 136 and smooth assembly among the lower plunger 138 constituting the spring probe 136, the upper plunger 154, and the spring 168.

Figure 7:
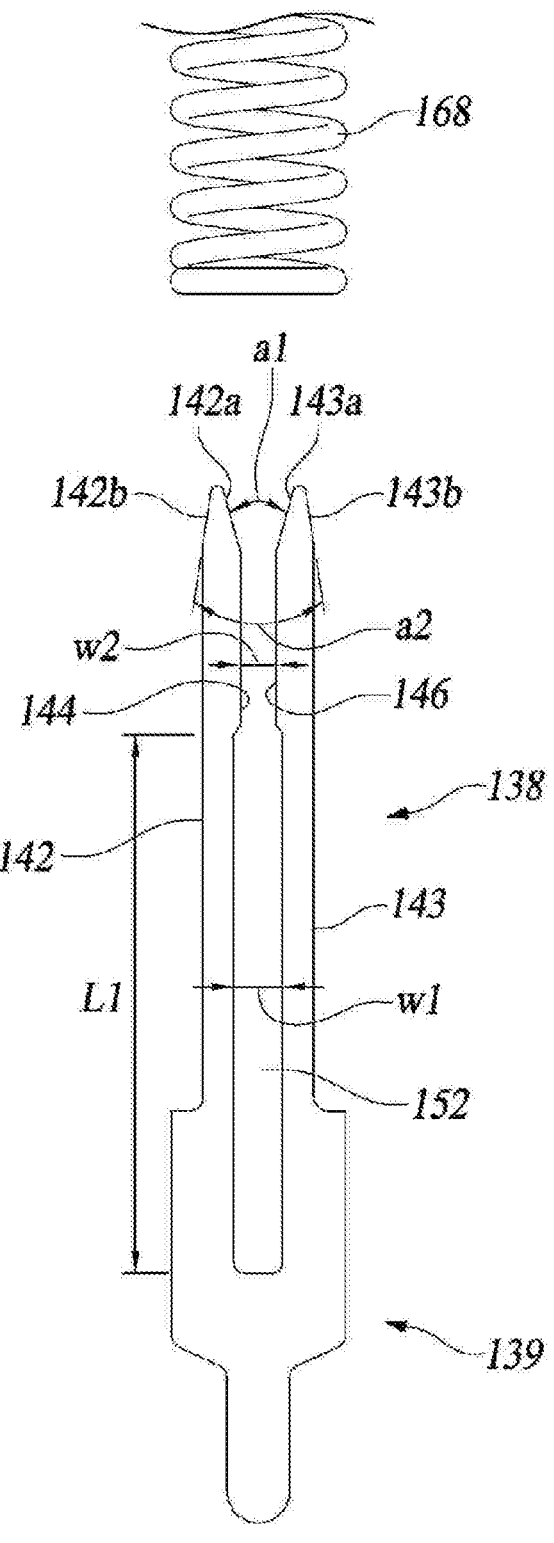
FIG. 7 illustrates the lower plunger and the spring of the spring probe according to an embodiment of the present disclosure.

Specifically, as shown in FIG. 7, the lower plunger 138 includes a first lower plunger arm internal inclination portion 142a and a first lower plunger arm external inclination portion 142b provided in the first lower plunger arm 142, and a second lower plunger arm internal inclination portion 143a and a second lower plunger arm external inclination portion 143b provided in the second lower plunger arm 143. The first lower plunger arm internal inclination portion 142a is provided in the form inclined to the inner side surface of the end of the first lower plunger arm 142, and the first lower plunger arm external inclination portion 142b is provided in a form inclined to the outer side surface of the end of the first lower plunger arm 142. Here, the inner surface of the first lower plunger arm 142 represents a surface facing the second lower plunger arm 143, and the outer surface represents the opposite surface. In addition, the second lower plunger arm internal inclination portion 143a is provided in a form inclined to the inner side surface of the end of the second lower plunger arm 143, and the second lower plunger arm external inclination portion 143b is provided in a form inclined to the outer side surface of the end of the second lower plunger arm 143. Here, the inner surface of the second lower plunger arm 143 represents a surface facing the first lower plunger arm 142, and the outer surface represents the opposite surface.

The first lower plunger arm internal inclination portion 142a and the second lower plunger arm internal inclination portion 143a are symmetrically disposed with respect to the longitudinal central axis of the lower plunger 138 to achieve a predetermined angle a1. Here, the angle a1 formed by the first lower plunger arm internal inclination portion 142a and the second lower plunger arm inner inclination portion 143a may be configured to be various sizes. As such, the first lower plunger arm internal inclination portion 142a and the second lower plunger arm internal inclination portion 143a are formed in the form of a gap between each other becoming larger towards the end of the lower plunger 138, so that the connection part 164 of the upper plunger 154 can be guided towards the slit 152 during the coupling process of the lower plunger 138 and the upper plunger 154. Thus, the connection part 164 of the upper plunger 154 is guided by the first lower plunger arm internal inclination portion 142a and the second lower plunger arm internal inclination portion 143a to smoothly enter the slit 152.

In addition, the first lower plunger arm external inclination portion 142b and the second lower plunger arm external inclination portion 143b are symmetrically disposed left and right with respect to the longitudinal central axis of the lower plunger 138 to achieve a predetermined angle a2. Because of the first lower plunger arm external inclination portion 142b and the second lower plunger arm external inclination portion 143b, the lower plunger 138 has a contour in which the width of its end gradually decreases, so that the lower plunger 138 can enter the cylindrical spring 168 more smoothly during the assembly process of the lower plunger 138 and the spring 168. The angle a2 between the first lower plunger arm external inclination portion 142b and the second lower plunger arm external inclination portion 143b may be configured to be various sizes.

In addition, the width w1 of the slit 152 is greater than the thickness of the upper plunger 154. Preferably, the width w1 of the slit 152 is greater than the thickness of the upper plunger 154, but it is preferable for the difference value between the width w1 of the slit 152 and the thickness of the upper plunger 154 to be 0.1~50% of the thickness of the upper plunger 154. When the difference between the width w1 of the slit 152 and the thickness of the upper plunger 154 is less than 0.1% of the thickness of the upper plunger 154, there is a high risk of severe friction between the upper plunger 154 and the lower plunger 138 because of manufacturing errors. When the difference value between the width w1 of the slit 152 and the thickness of the upper plunger 154 is greater than 50% of the thickness of the upper plunger 154, the upper plunger 154 and the lower plunger 138 may be tilted at an excessive tilting angle, which is undesirable.

In addition, the gap w2 between the pair of sliding protrusions 144 and 146 is smaller than the width w1 of the slit 152, and it is preferable for the difference value to be 0.1~70% of the width w1 of the slit 152. If the difference between the gap w2 between the sliding protrusions 144 and 146 and the width w1 of the slit 152 is less than 0.1% of the width w1 of the slit 152, there is a great risk that the connection part 164 of the upper plunger 154 will deviate from the slit 152. In addition, if the difference between the gap w2 between the sliding protrusions 144 and 146 and the width w1 of the slit 152 is greater than 70% of the width w1 of the slit 152, it is difficult for the upper plunger 154 to pass between the pair of sliding protrusions 144 and 146 and reach the slit 152, resulting in a poor assembly.

In addition, it is preferable for the length L1 of the slit 152 to be 40~90% of the total length of the lower plunger 138. When the length L1 of the slit 152 is less than 40% of the length of the lower plunger 138, it can lead to problems where the relative movement distance between the lower plunger 138 and the upper plunger 154 is too short to ensure stable stroke of the contact probe 131. In addition, when the length L1 of the slit 152 is greater than 90% of the length of the lower plunger 138, the strength of the lower plunger 138 is weakened and the design of the lower plunger contact part 139 or sliding protrusions 144 and 146 is difficult.

Figure 8:
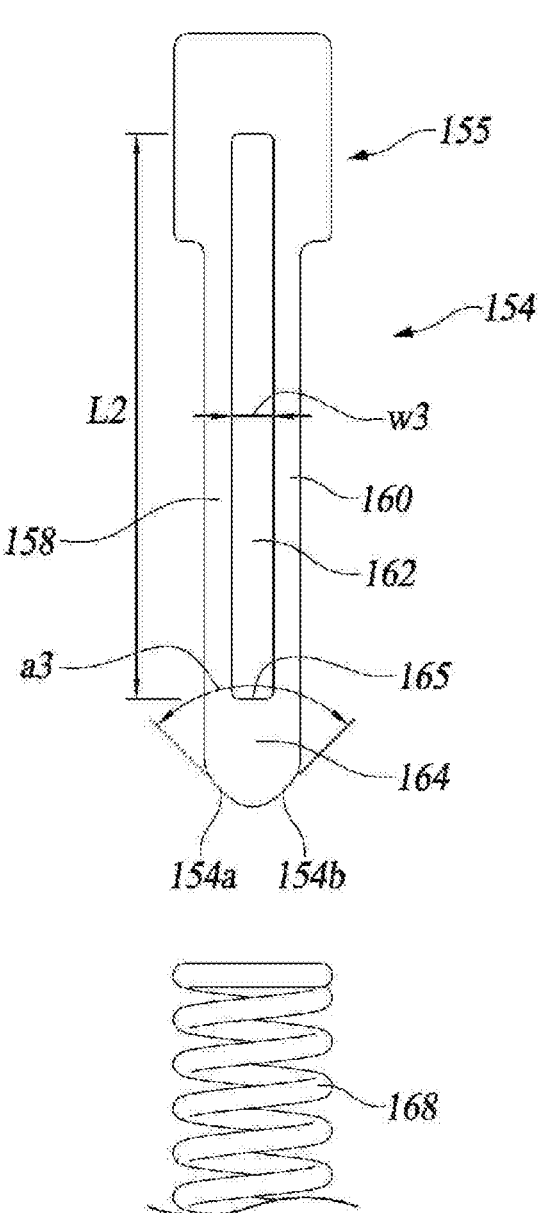
FIG. 8 illustrates the upper plunger and the spring of the spring probe according to an embodiment of the present disclosure.

With reference to FIG. 8, the upper plunger 154 includes a first upper plunger inclination portion 154*a* and a second upper plunger inclination portion 154*b* provided in the connection part 164. The first upper plunger inclination portion 154*a* and the second upper plunger inclination portion 154*b* are formed in a form inclined to both ends of the connection part 164, respectively. The first upper plunger inclination portion 154*a* and the second upper plunger inclination portion 154*b* are symmetrically disposed with respect to the longitudinal central axis of the upper plunger 154 to achieve a predetermined angle a3. Because of the first upper plunger inclination portion 154*a* and the second upper plunger inclination portion 154*b*, the upper plunger 154 has a contour in which the width of its ends gradually decreases, so that the upper plunger 154 can enter the cylindrical spring 168 more smoothly during the assembly process of the upper plunger 154 and the spring 168. The angle a3 between the first upper plunger inclination portion 154*a* and the second upper plunger inclination portion 154*b* may be configured to be various sizes.

In addition, the width w3 of the sliding groove 162 is greater than the thickness of the lower plunger 138. Preferably, the width w3 of the sliding groove 162 is greater than the thickness of the lower plunger 138, but it is preferable for the difference between the width w3 of the sliding groove 162 and the thickness of the lower plunger 138 to be 0.1~50% of the thickness of the lower plunger 138. When the difference value between the width w3 of the sliding groove 162 and the thickness of the lower plunger 138 is less than 0.1% of the thickness of the lower plunger 138, there is a high risk of severe friction between the upper plunger 154 and the lower plunger 138 because of manufacturing errors. In addition, if the difference value between the width w3 of the sliding groove 162 and the thickness of the lower plunger 138 is greater than 50% of the thickness of the lower plunger 138, the upper plunger 154 and the lower plunger 138 may be tilted at an excessive tilting angle, which is undesirable.

In addition, it is preferable for the length L2 of the sliding groove 162 to be 40~90% of the total length of the upper plunger 154. When the length L2 of the sliding groove 162 is less than 40% of the length of the upper plunger 154, it can lead to problems where the relative movement distance between the lower plunger 138 and the upper plunger 154 is too short to ensure stable stroke of the contact probe 131. In addition, when the length L2 of the sliding groove 162 is greater than 90% of the length of the upper plunger 154, the strength of the upper plunger 154 is weakened and the design of the upper plunger contact part 155, the connection part 164, and the detent part 165 are difficult.

As shown in FIG. 1, the test socket 100 according to an embodiment of the present disclosure may be installed on the pad 22 of the tester 20 and may contact the test device 10 to be tested. When the terminal 12 of the test device 10 contacts the testing probe 130, the upper plunger 154 moves while compressing the spring 168, and the elastic force of the spring 168 may be transmitted to the contact probe 131. Thus, the contact probe 131 may remain in contact with the terminal 12 of the test device 10 more stably.

Ideally, when the test device 10 is in contact with the testing probe 130, the spring 168 is compressed only in its longitudinal direction, but in reality, buckling occurs as the spring 168 is compressed. That is, when the test device 10 contacts the testing probe 130 and the spring 168 is subjected to a pressing pressure, the spring 168 is compressed in the longitudinal direction and is likely to bend laterally. When the spring 168 is bent laterally, the lower plunger 138 and the upper plunger 154 may be tilted in a combined state.

Figure 9A:
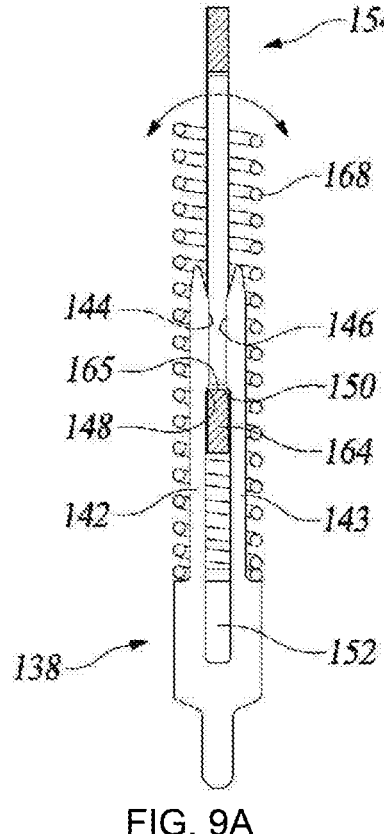
FIGS. 9A, 9B, 10 A, and 10B illustrate the electrical connection state between the lower plunger and the upper plunger according to the tilting phenomenon of the lower plunger and the upper plunger.
Figure 9B:
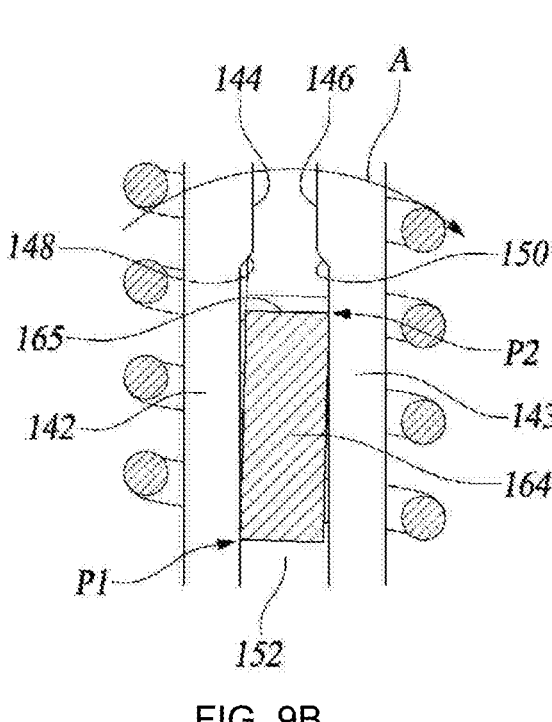

For example, as shown in FIG. 9A, in the process of moving the upper plunger 154 while compressing the spring 168, the upper plunger 154 may be tilted in the same direction as indicated by the arrow. As shown in FIG. 9B, when the upper plunger 154 is tilted in the direction of arrow A, the connection part 164 of the upper plunger 154 is tilted in the slit 152 of the lower plunger 138, so that one end of the connection part 164 contacts the first lower plunger arm 142 of the lower plunger 138 and the other end of the connection part 164 contacts the second lower plunger arm 143. Thus, the upper plunger 154 may remain electrically connected to the lower plunger 138 while forming two contact points, P1 and P2, with the lower plunger 138.

Figure 10A:
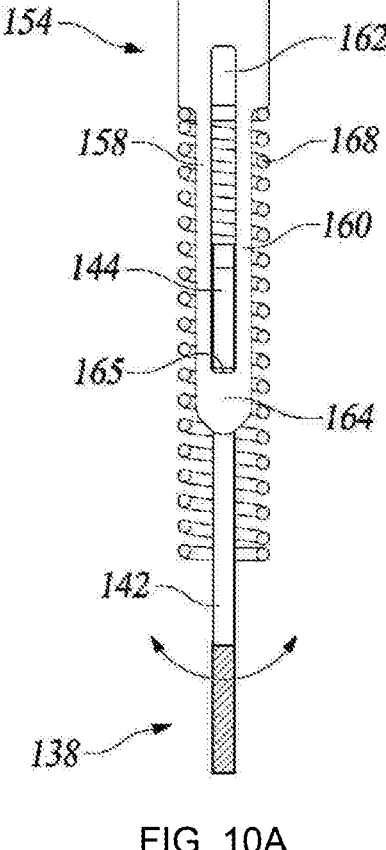
Figure 10B:
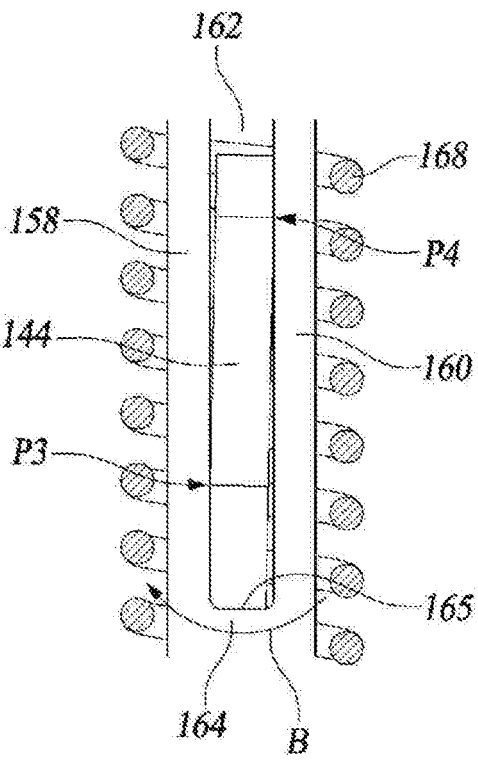

In addition, in the process of moving the upper plunger 154 while compressing the spring 168, the lower plunger 138 may be tilted in the same direction as indicated by the arrow as shown in FIG. 10A with respect to the upper plunger 154. As shown in FIG. 10B, when the lower plunger 138 is tilted in the direction of arrow B, the sliding protrusion 144 provided in the first lower plunger arm 142 of the lower plunger 138 is tilted in the sliding groove 162 of the upper plunger 154, so that one end of the sliding protrusion 144 contacts the first upper plunger arm 158 of the upper plunger 154 and the other end of the sliding protrusion 144 contacts the second upper plunger arm 160. Thus, the sliding protrusion 144 may contact the upper plunger 154 while forming two contact points, P3 and P4, with the upper plunger 154. When the lower plunger 138 is tilted with respect to the upper plunger 154, the sliding protrusion 146 provided in the second lower plunger arm 143 of the lower plunger 138 is also tilted in the sliding groove 162. Thus, the sliding protrusion 146 of the second lower plunger arm 143 may also contact the upper plunger 154 in the same manner as the sliding protrusion 144 of the first lower plunger arm 142 forming two contact points with the upper plunger 154, with one end of the sliding protrusion 146 contacting the first upper plunger arm 158 and the other end contacting the second upper plunger arm 160. As a result, the lower plunger 138 may remain electrically connected to the upper plunger 154 while forming four contact points with the upper plunger 154.

As described above, the test socket 100 according to an embodiment of the present disclosure may maintain the state of the lower plunger 138 and the upper plunger 154 of the spring probe 136 being contacted each other and forming two or more contact points when the test device 10 contacts the testing probe 130 and the spring probe 136 receives a compression force. Therefore, the electrical connection between the lower plunger 138 and the upper plunger 154 and the electrical connection between the contact probe 131 and the spring probe 136 are stable, the electrical resistance is small, and the signal transmission can be stably achieved.

In addition, the test socket 100 according to an embodiment of the present disclosure is easy to manufacture, only the contact probe 131 that repeatedly contacts the terminal 12 of the test device 10 can be replaced, and the maintenance cost according to the component replacement is required less.

FIGS. 11A-11D illustrate the assembly process of a test socket 100 according to an embodiment of the present disclosure. With reference to FIGS. 11A-11D, the test socket 100 according to an embodiment of the present disclosure may be manufactured in the following manner.

Figure 11A:
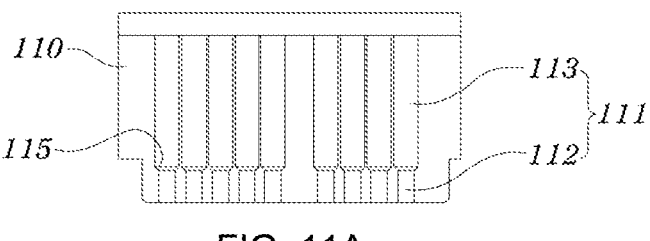
FIGS. 11A-11D illustrate the assembly process of a test socket according to an embodiment of the present disclosure.
Figure 11B:
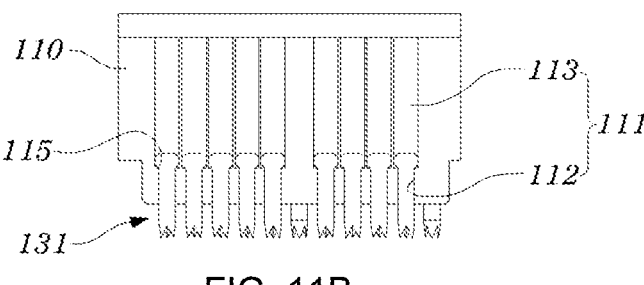

First, as shown in FIG. 11A, a socket housing 110 having a housing hole 111 is prepared, and as shown in FIG. 11B, a contact probe 131 is inserted into the housing hole 111.

Figure 11C:
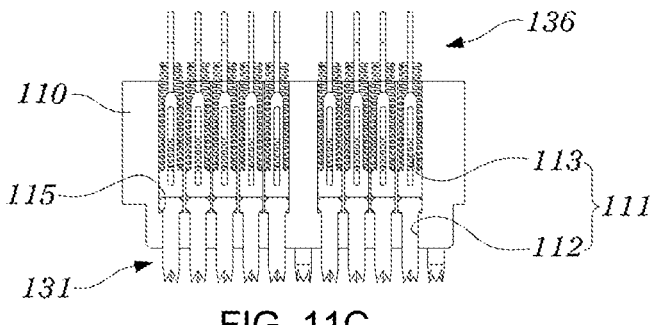

Next, as shown in FIG. 11C, the spring probe 136 is inserted into the housing hole 111 so that the upper plunger 154 of the spring probe 136 is in contact with the contact probe 131. The spring probe 136 may be simply assembled as described above and then inserted into the housing hole 111.

Figure 11D:
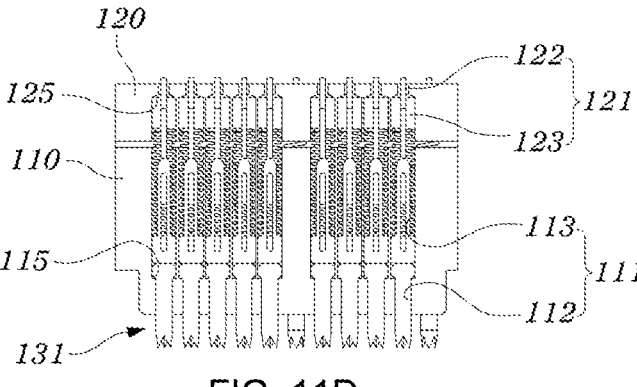

Next, as shown in FIG. 11D, the cover 120 is coupled to the socket housing 110 so that the lower plunger 138 of the spring probe 136 is inserted into the cover hole 121.

The completed test socket 100 may be coupled to the pad 22 of the tester 20 and used for testing of the test device 10.

On the other hand, FIGS. 12A-12D illustrate various embodiments of the testing probe.

First, the embodiment shown in FIG. 12A has a contact protrusion 171 in which the upper plunger 170 is in point contact with the contact probe 131.

In the embodiment shown in FIG. 12B, the upper plunger 175 has a plurality of contact protrusions 176 in point contact with the contact probe 131.

In the embodiment shown in FIG. 12C, the upper plunger 180 has a contact protrusion 181 that is in point contact with the contact probe 131. The contact protrusion 181 may have an outer surface that is spherical or curved.

In the embodiment shown in FIG. 12D, a contact probe 185 includes a contact protrusion 186 that is in point contact with the upper plunger 154. The contact protrusion 186 may have a spherical or curved surface. In addition, the contact protrusions 186 provided in the contact probe 185 to be in point contact with the upper plunger 154 may be made up of various other shapes such as a shape with a pointed tip, and the number of the contact protrusions 186 may be variously changed.

Although the present disclosure has been described with a desirable example, the scope of the present disclosure is not limited to the forms described and shown above.

For example, the drawing shows that the first upper plunger arm 158 and the second upper plunger arm 160 of the upper plunger 154 are connected by a connection part 164, but the upper plunger 154 may be made up of the first upper plunger arm 158 and the second upper plunger arm 160 separated from each other. In this case, to prevent the sliding protrusions 144 and 146 of the lower plunger 138 from deviating from the sliding grooves 162, the detent part that may contact the sliding protrusions 144 and 146 may be connected to at least one of the first upper plunger arm 158 and the second upper plunger arm 160. In addition, the first upper plunger arm 158 and the second upper plunger arm 160 may have a sliding protrusion inserted into the slit 152 of the lower plunger 138.

The present disclosure is shown and described in connection with preferred embodiments for illustrating the principles of the present disclosure, but the present disclosure is not limited to the configuration and operation as shown and described as such. On the contrary, those skilled in the art will be able to understand well that a number of changes and modifications to the present disclosure are possible without deviating from the idea and scope of the inventions described herein.

EXPLANATION OF REFERENCE NUMERALS

| [Explanation of Codes] | |
| --- | --- |
| 10: test device | 20: tester |
| 100: test socket | 110: socket housing |
| 111: housing hole | 120: cover |
| 121: cover hole | 130: testing probe |
| 131, 185: contact probe | 132: first contact part |
| 133: tip part | 134: second contact part |
| 136: spring probe | 138: lower plunger |
| 139: lower plunger contact part | 140: protrusion part |
| 141, 156: ledge part | 142: first lower plunger arm |
| 143: second lower plunger arm | 144, 146: sliding protrusion |
| 148, 150: stopper part | 152: slit |
| 154, 170, 175, 180: upper plunger | 155: upper plunger contact |
| 158: first upper plunger arm | 160: second upper plunger |
| 162: sliding groove | 164: connection part |
| 165: detent part | 168: spring |

The invention claimed is:

1. A test socket for performing an electrical testing on a test device by connecting a terminal of a test device to a pad of a tester that generates a test signal comprising:

a testing probe comprising a lower plunger in contact with the pad;

an upper plunger coupled to the lower plunger;

a spring probe comprising a cylindrical spring for applying elasticity to the lower plunger and the upper plunger for the lower plunger and the upper plunger to be separated from each other; and a contact probe with an upper side contacting a terminal of the test device and a lower side contacting the upper plunger;

a socket housing that provides housing holes at each position corresponding to a terminal of the test device and accommodates the contact probe and the spring probe so that an upper side of the contact probe protrudes at each of the housing holes; and a cover that provides cover holes at each position corresponding to the housing holes and is fastened to the socket housing so that a lower side of the lower plunger protrudes at each of the cover holes, wherein the upper plunger provides a sliding groove, the lower plunger comprises a pair of sliding protrusions inserted into the sliding groove, and the upper plunger and the lower plunger are coupled in a sliding manner; and wherein the upper plunger comprises an upper plunger contact part in contact with the contact probe, and a first upper plunger arm and a second upper plunger arm extending from the upper plunger contact part and being disposed facing each other, wherein the sliding groove is located between the first upper plunger arm and the second upper plunger arm, and the sliding protrusion is tilted inside the sliding groove so that one end of the sliding protrusion is in contact with the first upper plunger arm, the other end of the sliding protrusion is in contact with the second upper plunger arm, and two or more contact points with the upper plunger are formed.

2. The test socket of claim 1, wherein the lower plunger provides that the pair of sliding protrusions contact the upper plunger and the lower plunger comprises a stopper part that prevents the pair of sliding protrusions from deviating from the sliding groove.

3. The test socket of claim 2, wherein a detent part is connected to at least one of the first upper plunger arm and the second upper plunger arm to prevent the pair of sliding protrusions from deviating from the sliding groove by contacting the stopper part.

4. The test socket of claim 3, wherein the upper plunger comprises a connection part connecting an end of the first upper plunger arm and an end of the second upper plunger arm, and the detent part is provided in the connection part.

5. The test socket of claim 4, wherein the upper plunger comprises a first upper plunger inclination portion and a second upper plunger inclination portion formed inclined to ends of the connection and symmetrical with respect to a longitudinal central axis of the upper plunger.

6. The test socket of claim 1, wherein the lower plunger comprises:

a lower plunger contact part in contact with the pad;

a first lower plunger arm and a second lower plunger arm extending from the lower plunger contact part and being disposed facing each other; and a slit provided between the first lower plunger arm and the second lower plunger arm, wherein the sliding groove is provided to the first lower plunger arm and the second lower plunger arm, respectively, and a connection part connecting the first upper plunger arm and the second upper plunger arm to be inserted into the slit, wherein the connection part is tilted inside the slit so that one end of the connection part is in contact with the first lower plunger arm, an other end is in contact with the second lower plunger arm, and two or more contact points with the lower plunger are formed.

7. The test socket of claim 6, wherein the lower plunger comprises:

a first lower plunger arm internal inclination portion provided in the form inclined to an inner side surface of the first lower plunger arm end;

a first lower plunger arm external inclination portion provided in the form inclined to an outer side surface of the first lower plunger arm end;

a second lower plunger arm internal inclination portion provided in the form inclined to an inner side surface of the second lower plunger arm end; and a second lower plunger arm external inclination portion provided in the form inclined to an outer side surface of the second lower plunger arm end, wherein the first lower plunger arm internal inclination portion and the second lower plunger arm internal inclination portion are symmetrical with respect to a longitudinal central axis of the lower plunger, and the first lower plunger arm external inclination potion and the second lower plunger arm external inclination portion are symmetrical with respect to the longitudinal central axis of the lower plunger.

8. The test socket of claim 1, wherein the upper plunger comprises a contact protrusion in point contact with the contact probe.

9. The test socket of claim 1, wherein the contact probe comprises a contact protrusion in point contact with the upper plunger.

10. The test socket of claim 1, wherein the contact probe comprises a plurality of tip parts in point contact with the terminal of the test device.

* * * * *